(12) United States Patent
Polleux et al.

(10) Patent No.: US 10,073,228 B2
(45) Date of Patent: Sep. 11, 2018

(54) PROCESS FOR MANUFACTURING VERTICAL OPTICAL COUPLING STRUCTURES

(71) Applicants: CNAM—Conservatoire National Des Arts Et Metiers, Paris (FR); Chambre de Commerce et D'Industrie de Region Paris Ile de France (ESIEE Paris), Noisy le Grand (FR)

(72) Inventors: Jean-Luc Polleux, Houdancourt (FR); Carlos Araujo-Viana, Neuilly-sur-Marne (FR)

(73) Assignees: CNAM—Conservatoire National Des Arts Et Metiers (FR); Chambre de Commerce et D'Industrie de Region Paris Ile de France (ESIEE Paris) (FR)

( * ) Notice: Subject to any disclaimer, the term of this patent is extended or adjusted under 35 U.S.C. 154(b) by 0 days.

(21) Appl. No.: 15/117,067

(22) PCT Filed: Feb. 6, 2015

(86) PCT No.: PCT/EP2015/052560
§ 371 (c)(1),
(2) Date: Aug. 5, 2016

(87) PCT Pub. No.: WO2015/118131
PCT Pub. Date: Aug. 13, 2015

(65) Prior Publication Data
US 2017/0176697 A1    Jun. 22, 2017

(30) Foreign Application Priority Data
Feb. 7, 2014   (FR) ...................... 14 50962

(51) Int. Cl.
*G02B 6/42* (2006.01)
*G03F 7/00* (2006.01)
(Continued)

(52) U.S. Cl.
CPC ............. *G02B 6/424* (2013.01); *G02B 6/423* (2013.01); *G02B 6/4204* (2013.01);
(Continued)

(58) Field of Classification Search
CPC ...... G02B 6/424; G02B 6/423; G02B 6/4249; G03F 7/0002; G03F 7/2002; G03F 7/26
See application file for complete search history.

(56) References Cited

U.S. PATENT DOCUMENTS

| 4,995,695 A | * | 2/1991 | Pimpinella | ........... G02B 6/4202 385/49 |
| 5,647,044 A | * | 7/1997 | Basavanhally | ........ G02B 6/423 385/92 |

(Continued)

FOREIGN PATENT DOCUMENTS

| EP | 1722258 A1 | 11/2006 |
| GB | 1163258 A | * 9/1969 ............. H01L 33/56 |

(Continued)

OTHER PUBLICATIONS

International Search Report in PCT/EP2015/052560, dated May 6, 2015, 4 pages.
(Continued)

*Primary Examiner* — Peter Radkowski
(74) *Attorney, Agent, or Firm* — Lerner, David, Littenberg, Krumholz & Mentlik, LLP

(57) ABSTRACT

The present invention relates to a method for manufacturing vertical optical coupling structures (1) between first optical or optoelectronic components (2) and second optical or optoelectronic components (3). Said vertical optical cou-
(Continued)

pling structures are made by: (1) depositing a main layer (A) onto a substrate (25) including second optical or optoelectronic components; and (ii) lithography and/or physico-chemical etching of the main layer. Each vertical optical coupling structure is made such as to be located facing and making contact with a second optical component located in the substrate. The unitary main layer comprises generally frusto-conical coupling portions (12) consisting of a material having a refractive index greater than the refractive index of air. The coupling portions each have: a first transverse end surface (121) for making contact with the sending or receiving surface (21) of a first optical or optoelectronic component; and a second transverse end surface (122) that is in contact with the sending or receiving surface (31) of the second optical or optoelectronic component.

20 Claims, 14 Drawing Sheets

(51) Int. Cl.
G03F 7/20 (2006.01)
G03F 7/26 (2006.01)
(52) U.S. Cl.
CPC ......... *G02B 6/4249* (2013.01); *G03F 7/0002* (2013.01); *G03F 7/2002* (2013.01); *G03F 7/26* (2013.01)

(56) References Cited

U.S. PATENT DOCUMENTS

| | | | | |
|---|---|---|---|---|
| 5,907,162 A * | 5/1999 | Maruyama | ........... | G02B 6/4204 257/100 |
| 6,404,960 B1 * | 6/2002 | Hibbs-Brenner | ........ | G02B 6/26 385/49 |
| 6,709,607 B2 * | 3/2004 | Hibbs-Brenner | ........ | G02B 6/26 216/24 |
| 6,767,138 B1 * | 7/2004 | Miyachi | ............... | G02B 6/4277 385/76 |
| 6,792,179 B2 * | 9/2004 | Lu | ............................ | G02B 6/43 385/31 |
| 6,817,781 B2 * | 11/2004 | Ide | ....................... | G02B 6/4292 385/139 |
| 7,031,578 B2 * | 4/2006 | Marion | ................ | G02B 6/4204 216/24 |
| 7,281,860 B2 * | 10/2007 | Fujita | ..................... | H01L 33/60 257/98 |
| 7,326,583 B2 * | 2/2008 | Andrews | ................. | H01L 33/58 257/E33.058 |
| 7,352,066 B2 * | 4/2008 | Budd | ...................... | G02B 6/43 257/13 |
| 7,880,254 B2 * | 2/2011 | Furuyama | ......... | H01L 31/02327 257/433 |
| 8,278,841 B2 * | 10/2012 | Brukilacchio | ............ | F21K 9/00 315/152 |
| 8,548,287 B2 * | 10/2013 | Thacker | ................... | G02B 6/26 385/14 |
| 8,805,131 B2 * | 8/2014 | Shiraishi | .............. | G02B 6/4214 385/14 |
| 2004/0037507 A1 * | 2/2004 | Marion | ................ | G02B 6/4204 385/52 |
| 2005/0002597 A1 * | 1/2005 | Penty | ...................... | G02F 2/004 385/14 |
| 2005/0201118 A1 * | 9/2005 | Godo | ........................ | F21V 5/04 362/555 |
| 2006/0039658 A1 * | 2/2006 | Furuyama | ................ | G02B 6/25 385/90 |
| 2006/0263015 A1 * | 11/2006 | Fincato | ................ | G02B 6/4201 385/92 |
| 2006/0291245 A1 * | 12/2006 | Shimada | ................... | F21V 5/04 362/612 |
| 2007/0114547 A1 * | 5/2007 | Fujita | ................... | G02B 6/4206 257/98 |
| 2008/0123198 A1 * | 5/2008 | Fujita | ................... | G02B 6/4206 359/709 |
| 2009/0008734 A1 * | 1/2009 | Furuyama | ........... | H01L 31/0203 257/435 |
| 2011/0001431 A1 * | 1/2011 | Brukilacchio | ............ | F21K 9/00 315/152 |
| 2012/0002915 A1 * | 1/2012 | Shiraishi | .............. | G02B 6/4214 385/14 |
| 2013/0121635 A1 * | 5/2013 | Thacker | ................... | G02B 6/26 385/15 |

FOREIGN PATENT DOCUMENTS

| | | | |
|---|---|---|---|
| GB | 1409793 A | 10/1975 | |
| JP | 56046573 A * | 4/1981 | ........... G02B 6/4206 |
| JP | 5646573 B2 | 12/2014 | |
| WO | 9220004 A1 | 11/1992 | |
| WO | 2011002508 A2 | 1/2011 | |

OTHER PUBLICATIONS

Preliminary Search Report in FR 1450962, dated Oct. 31, 2014, 3 pages.
Ouchi et al., "Direct Coupling of VCSELs to Plastic Optical Fibers Using Guide Holes Patterned in a Thick Photoresist," IEEE Photonics Technology Letters, vol. 14, No. 3, pp. 263-265, Mar. 2002.

* cited by examiner i) Deposition of the first layer ii) UV irradiation through a mask After baking, the exposed resin polymerizes and becomes insoluble to the developer After development, the final pattern is left, showing sides controlled by the irradiation and development

PROCESS FOR MANUFACTURING VERTICAL OPTICAL COUPLING STRUCTURES

CROSS REFERENCE TO RELATED APPLICATIONS

The present application is a national phase entry under 35 U.S.C. § 371 of International Application No. PCT/EP2015/052560 filed Feb. 6, 2015, published in English, which claims priority from EP Patent Application No. 1450962 filed Feb. 7, 2014, all of which are incorporated herein by reference.

FIELD OF THE INVENTION

The present invention relates to the field of optical coupling structures between optical or optoelectronic components. The invention applies in particular to the connection of a matrix of optical fibers to a matrix of fast photodetectors, of small dimensions, with vertical illumination, or a matrix of fast laser diodes of small dimensions, with a vertical cavity emitting through the surface, i.e. Vertical-Cavity Surface-Emitting Lasers or VCSEL, collectively and passively.

PRIOR ART

Coupling devices are known that are intended to transmit a light signal between an emitting optical fiber bundle and another receiving optical fiber bundle, or one or more optical or optoelectronic components, active or passive, such as connectors, light-emitting or laser diodes, etc.

In order to minimize signal losses at the input or output of the optical fibers due to optical misalignment, back-reflection or other optical-geometrical effects, the coupling device must provide a precise alignment of the axis of the optical fibers and avoid a discontinuity in the refractive index between the core of the optical fiber and the outside medium. The coupling of an optical fiber and a VCSEL (for Vertical-Cavity Surface-Emitting Laser) generally requires an alignment to the nearest micron for single-mode fibers and to the nearest few microns for multi-mode fibers. In addition, the bulk of the coupling device must be reduced as much as possible for obvious practical reasons, and to comply with the increasing miniaturization of optoelectronic devices.

There are known active techniques for aligning a fiber and a laser emitter using two orientation mechanisms. The laser emitter produces a beam which is actively oriented into the optical fiber, which is also oriented actively. Both orientation mechanisms have the function of aligning the laser and the fiber to obtain a maximum output. When the alignment is obtained, the fiber is attached to the laser emitter by welding or bonding. This active alignment technique leads to a high cost for the assembly obtained.

In addition, the coupling systems of the prior art, for example with ball lenses, pose the problem of an alignment in three parts, namely the emission component, the reception component, and the lens itself. It is then an alignment with six degrees of freedom.

Passive alignment techniques have also been proposed. The document "Direct Coupling of VCSELs to Plastic Optical Fibers Using Guide Holes Patterned in a Thick Photoresist", T. Ouchi, for example, describes a process for coupling a VCSEL emitting through the back face and an optical fiber that consists in forming a guide hole in the substrate of the VCSEL. Guide holes are drilled in the substrate bearing the devices and the optical fibers are slid into these holes. The guide holes can be tapered to improve guiding of the fiber.

However, although this technique guides the fiber it only provides optical coupling by direct contact, so-called "butt-coupling". It also does not focus the optical beam and does not allow the efficient coupling of either a VCSEL of small dimensions or divergent from the fiber, or of a VCSEL with one fiber, whose core is of a reduced dimension such as single-mode fibers, or a fiber with a photodetector of a smaller dimension than the fiber.

Documents [GB1409793, EP1722258, US20080123198, WO2011/002508A2] are about optical coupling structures composed of mechanical parts attached to one another. These documents propose the passive coupling of photodetectors or lasers on condition that the latter are of large dimensions, i.e. for dimensions often greater than 50 μm. This involves producing coupling of a fiber with a single emitter or receiver device, in the case of documents [GB1409793, EP1722258, US20080123198], or even a fiber with a group of optical emitter or receiver devices in a quantified, limited number (1, 2, 4, typically less than 16) for the patent [WO2011/002508A2].

None of the documents mentioned above proposes a collective solution allowing the production of structures for coupling a matrix N of fibers to a matrix N of optical devices, sources or detectors.

There is therefore a need for a simple coupling device, which can be produced collectively, is easily adaptable, of small thickness, and capable of focusing the optical beam and improving the degree of coupling without requiring active alignment.

PRESENTATION OF THE INVENTION

One aim of the invention is to make it possible to couple two optical or optoelectronic components, such as a VCSEL laser and an optical fiber, in a simple and inexpensive manner, namely collectively and passively. This aim is achieved in the context of the present invention, owing to a vertical optical coupling structure between two optical or optoelectronic components, the coupling structure being characterized in that it comprises a coupling part of an overall truncated cone shape composed of a material with a refractive index greater than the refractive index of the ambient medium, generally air, the coupling part having a first transverse surface intended to be in contact with the emission or reception surface of a first optical or optoelectronic component and a second transverse surface intended to be in contact with the emission or reception surface of a second optical or optoelectronic component.

The invention makes it possible to couple optical fibers, particularly single-mode or multi-mode optical fibers. Given the low outputs obtained with coupling of single-mode optical fibers, the invention is particularly suitable and advantageous for this type of optical fiber.

The invention is advantageously completed by the following features, taken individually or in any one of their technically possible combinations:

the material of the coupling part has a refractive index between 1.2 and 4.2;
the material of the coupling part has a refractive index between the refractive indices of the emission or reception surfaces of the two optical or optoelectronic components;
the material of the coupling part is a polymer;
the material of the coupling part is a photosensitive resin;

the material of the coupling part is made of SU-8, benzocyclobutene, parylene, polyethyl methacrylate or silicon;

the vertical optical coupling structure further includes a support part suitable for bearing on a substrate receiving one of the optical components in order to hold the coupling part in the coupling position in relation to the emission or reception surface of the optical component;

the support part comprises a frame suitable for bearing on the substrate and suspension arms connecting the coupling part to the frame, and extending radially from the coupling part;

the suspension arms have a triangular cross section, with one apex of the triangle oriented on the side of the truncated face of the coupling part;

the support part further includes a structure for holding the fiber having in its center a cylindrical housing suitable for receiving one end of the optical fiber;

the vertical optical coupling structure further includes a separation layer between the fiber-holding structure and the support;

the coupling part is of truncated cone shape with a circular or rectangular cross-section.

the coupling part and its support part are produced as a matrix, in a single step of collective manufacturing on the substrate receiving a matrix of optical or optoelectronic components to be coupled.

The invention relates to a method for manufacturing a vertical optical coupling structure as described above, manufactured for example by lithography, photolithography and/or physico-chemical etching of a substrate receiving one of the optical components. It thus produces collective and passive coupling.

In other words, the present invention relates to a method for manufacturing vertical optical coupling structures between first optical or optoelectronic components and second optical or optoelectronic components, making it possible to produce a monolithic collective coupling device, referred to as a matrix, said vertical coupling structures being produced:

by deposition or transfer of a main layer onto a substrate comprising second optical or optoelectronic components in a step (i)

by lithography and/or by physico-chemical etching of the main layer in a step (ii), each vertical optical coupling structure being produced to be located facing and in contact with a second optical component located in the substrate, the monolithic main layer including coupling parts of an overall truncated cone shape composed of a material with a refractive index greater than the refractive index of air; the coupling parts each having a first transverse end surface intended to be in contact with the emission or reception surface of a first optical or optoelectronic component, and a second transverse end surface which is in contact with the emission or reception surface of the second optical or optoelectronic component.

The term "main layer" is understood to mean a layer that can be deformable such as resin or a solid layer such as a silicon wafer, which is transferred onto the substrate and etched.

This main layer is deposited over the whole substrate and is not housed in any mold of any kind.

The term "deposition" relates equally to the deposition of a malleable layer to the substrate and the transfer equivalent to installation of a solid wafer, for example made of silicon, onto the substrate.

The step of lithography and/or physico-chemical etching of the main layer is done by photolithography.

The step of lithography and/or physico-chemical etching of the main layer makes it possible to produce for each vertical optical coupling structure a support part equipped with a suspended frame suitable for bearing on the substrate, and suspension arms connecting the coupling part to the frame.

A second layer B is deposited onto the main layer, this second layer making it possible to produce, by lithography and/or physico-chemical etching, holding structures intended to receive a first optical or optoelectronic component in a cylindrical housing.

The main layer is a photosensitive resin or a non-photosensitive resin.

The main layer is made of silicon.

Imprint photolithography and/or nano-imprint photolithography techniques are used to produce the vertical coupling structure.

The main layer is machined by reactive-ion etching and/or deep reactive-ion etching techniques.

The substrate is hollowed out at the housings to arrange various second optical or optoelectronic components in these housings, flush with an upper surface of the substrate; the second optical or optoelectronic components (3) being connected to one another by metal tracks.

The first and second optical or optoelectronic components have dimensions of less than 20 μm.

The present invention also relates to a structure for vertical optical coupling between two optical or optoelectronic components, the structure being made from the method defined above.

The present invention also relates to an assembly including:

a first optical or optoelectronic component having an emission or reception surface, and;

a second optical or optoelectronic component having an emission or reception surface a vertical coupling structure as defined by one of claims 11 to 17, comprising a coupling part of an overall truncated cone shape composed of a material with a refractive index greater than the refractive index of air and having a given height; the coupling part having a first transverse surface, having a first diameter and intended to be in contact with the emission or reception surface of the first optical or optoelectronic component; and a second transverse surface, having a second diameter, and intended to be in contact with the emission or reception surface of the second optical or optoelectronic component;

the assembly being characterized in that the dimensions of the first and second transverse surfaces are optimized so as to maximize overlapping of the transverse distribution of the output optical field of the first optical or optoelectronic component with the emission or reception surface of the second optical or optoelectronic component while allowing a variation in the positioning between the first optical or optoelectronic component and the first transverse surface, and between the second optical or optoelectronic component and the second transverse surface, and in that for a given second diameter, at a given wavelength of an optical beam, the ratio of the height to the first diameter is determined in such a way as to provide optical coupling of at least 60% between the first optical or optoelectronic component and the second optical or optoelectronic component, for a variation of misalignment between the two optical or optoelectronic components, of at least 5 micrometers, more or less, in relation to a position of maximum coupling between the two optical or optoelectronic components.

The present invention also relates to a matrix comprising several coupling structures.

The present invention also relates to an assembly comprising a matrix having several coupling structures, a matrix of second optical components located in a substrate and/or a matrix of holding structures intended to receive first optical components, these matrices bearing on one another.

DESCRIPTION OF THE FIGURES

Other purposes, features and advantages will become apparent from the following detailed description with reference to the drawings, given as illustrations and non-limiting, among which.

DETAILED DESCRIPTION OF THE INVENTION

Figure 1:
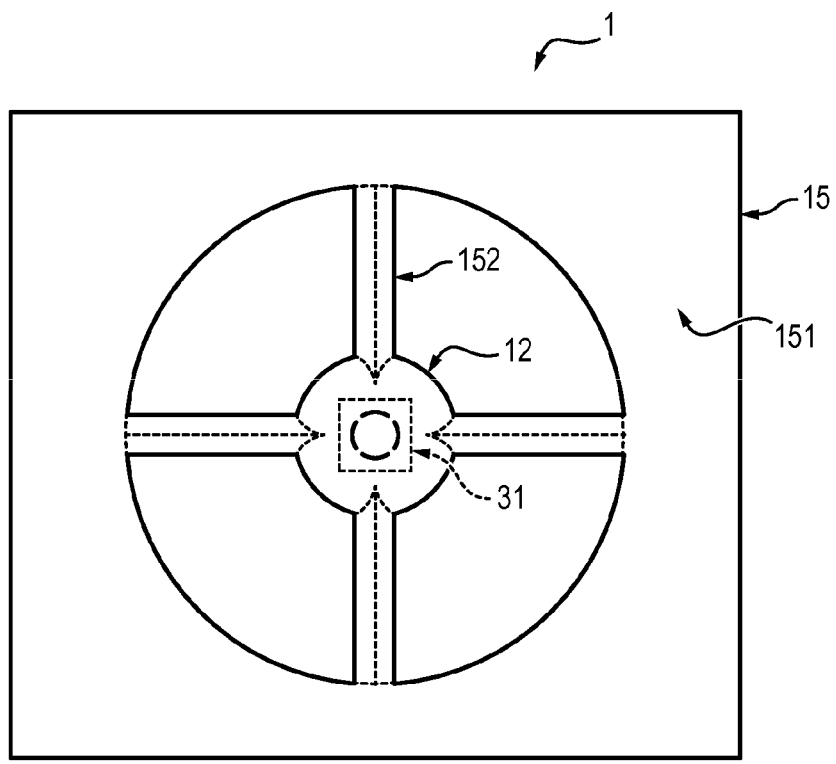
FIG. 1 represents a coupling structure according to a possible embodiment of the invention.
Figure 5:
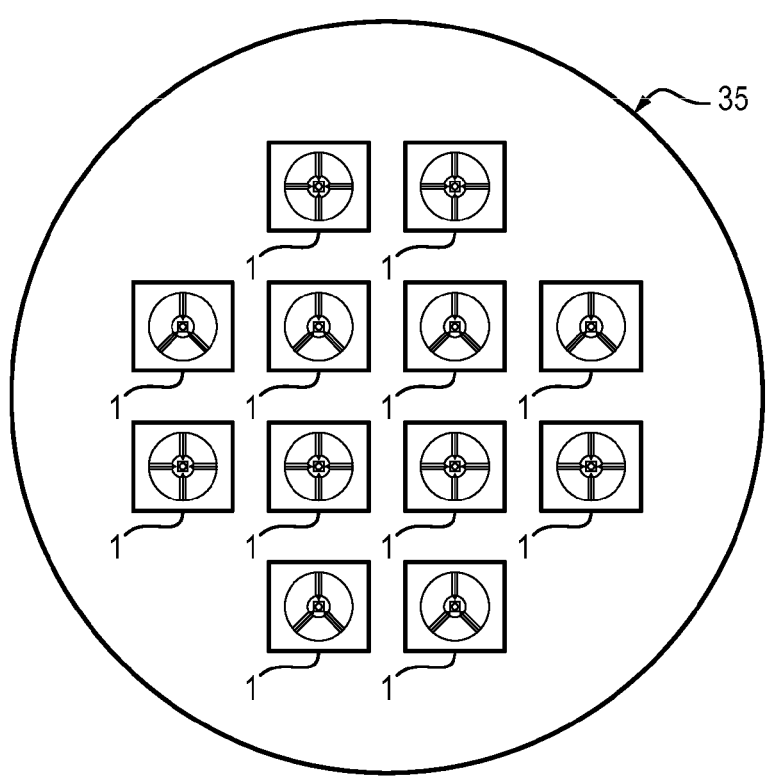
FIG. 5 represents several coupling structures according to a possible embodiment of the invention coupled to an optical or optoelectronic component.
Figure 13:
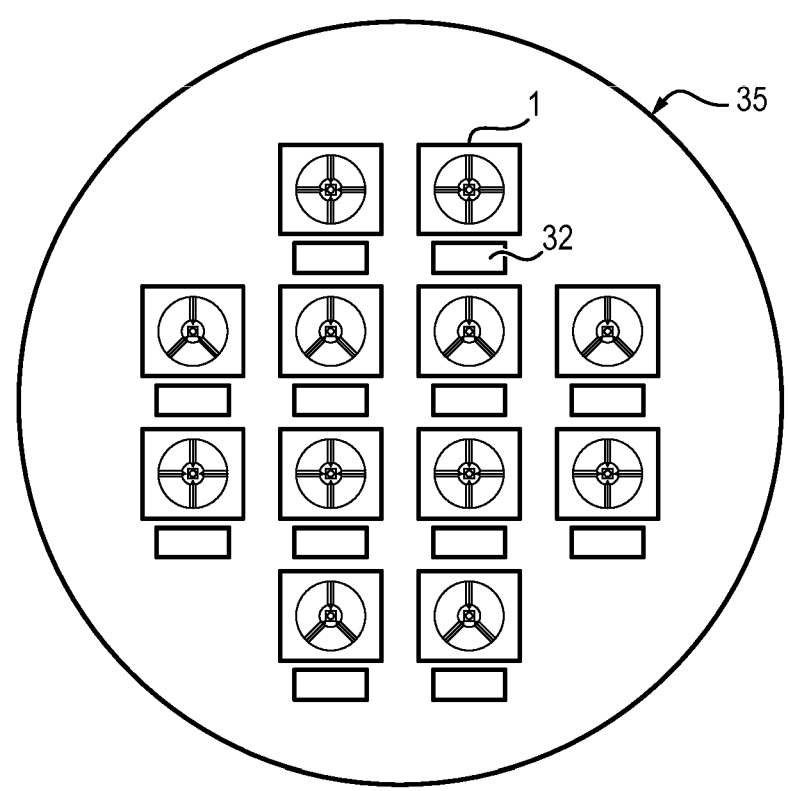
FIG. 13 illustrates the positioning of the electrical contacts of an optoelectronic component on a coupling structure according to an embodiment of the invention.

FIG. 1 represents an elementary vertical coupling structure between two optical or optoelectronic components having emission or reception surfaces of possibly different dimensions, this vertical optical coupling structure being produced N times in a matrix by the method according to the invention, as described in FIGS. 5 and 13.

Figure 2:
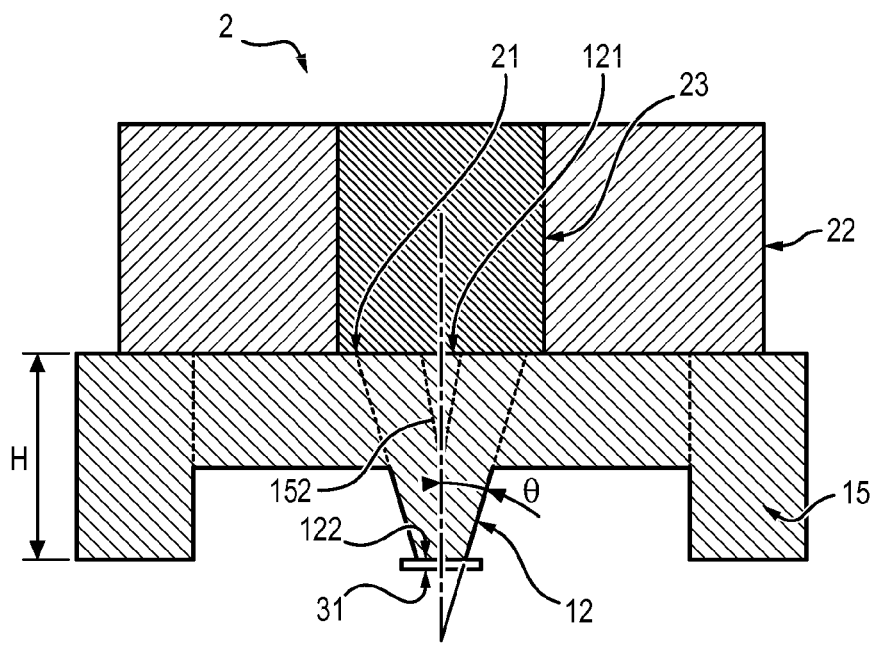
FIG. 2 represents a section view of the coupling structure coupled to a fiber.

In FIG. 2, the first optical or optoelectronic component is an optical fiber and the second a VCSEL.

The term "vertical" optical coupling is understood to mean vertical in relation to the plane of the substrate on which the coupling structure is produced, which is also that of the fiber-holding structure.

A step-index optical fiber is composed of a transparent cylindrical core 23 of constant index $N_1$ surrounded by a concentric sheath 22 of index $N_2<N_1$. The core 23 is for example made of silica with a refractive index of $N_1=1.456$ and a core diameter of 9 µm and the sheath 22 made of silica with a refractive index of $N_2=1.410$ and a diameter of 125 µm. The core 23 of a single-mode optical fiber typically has a diameter of 9 µm whereas a VCSEL has an emission surface with a diameter of approximately 8 to 12 µm. The invention is especially advantageous for coupling with lasers or photodetectors of lesser dimensions, typically of 1 to 10 µm.

The coupling structure 1 comprises a coupling part 12 of overall truncated cone shape defining a volume filled with a material having a refractive index greater than that of the ambient medium, the ambient medium generally being air.

The coupling part 12 is a cone truncated by a plane perpendicular to its axis of revolution.

The term "truncated cone" can be erroneously extended to a prismoid, a truncated pyramid, or a convergent shape connecting two parallel plane surfaces of different sizes.

With reference to FIG. 2, the base of the cone 121, which is the face perpendicular to the axis of revolution of the larger surface, is intended to be brought into contact with the emission or reception surface 21 of a second optical or optoelectronic component 2.

Figure 3:
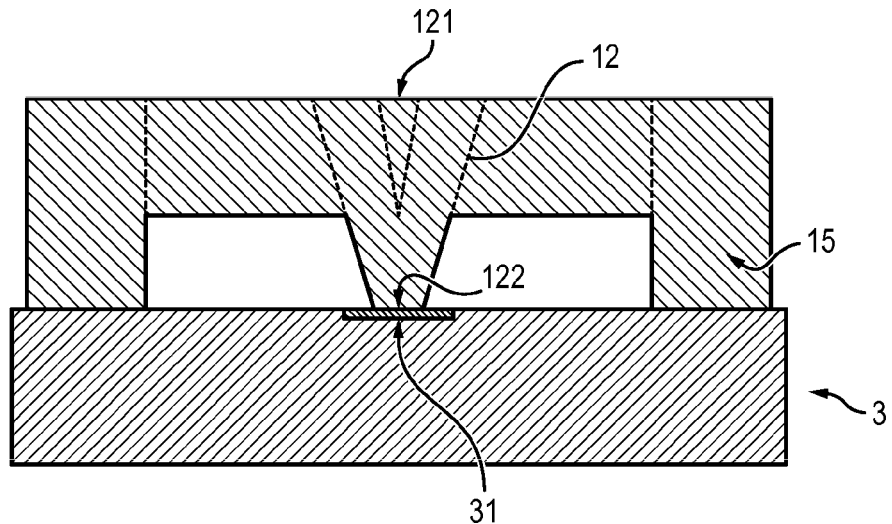
FIG. 3 represents a section view of the coupling structure coupled to an optical or optoelectronic component.

With reference to FIG. 3, the truncated face 122, which is the face perpendicular to the axis of revolution of the smaller surface, is intended to be brought into contact with the emission or reception surface 31 of a first optical or optoelectronic component 3.

The area of the base of the cone 121 is generally less than the area of the emission or reception surface 21 of the first component 2. In the same way, the truncated face 122 of the cone has an area less than or equal to that of the emission or reception surface 31 of the second component 3. In addition, the base of the cone 121 is suitable for being covered entirely by the emission or reception surface 21 of the first component 2. In the same way, the truncated face of the cone 122 is suitable for being covered by the emission or reception surface 31 of the second component 3.

Figure 4:
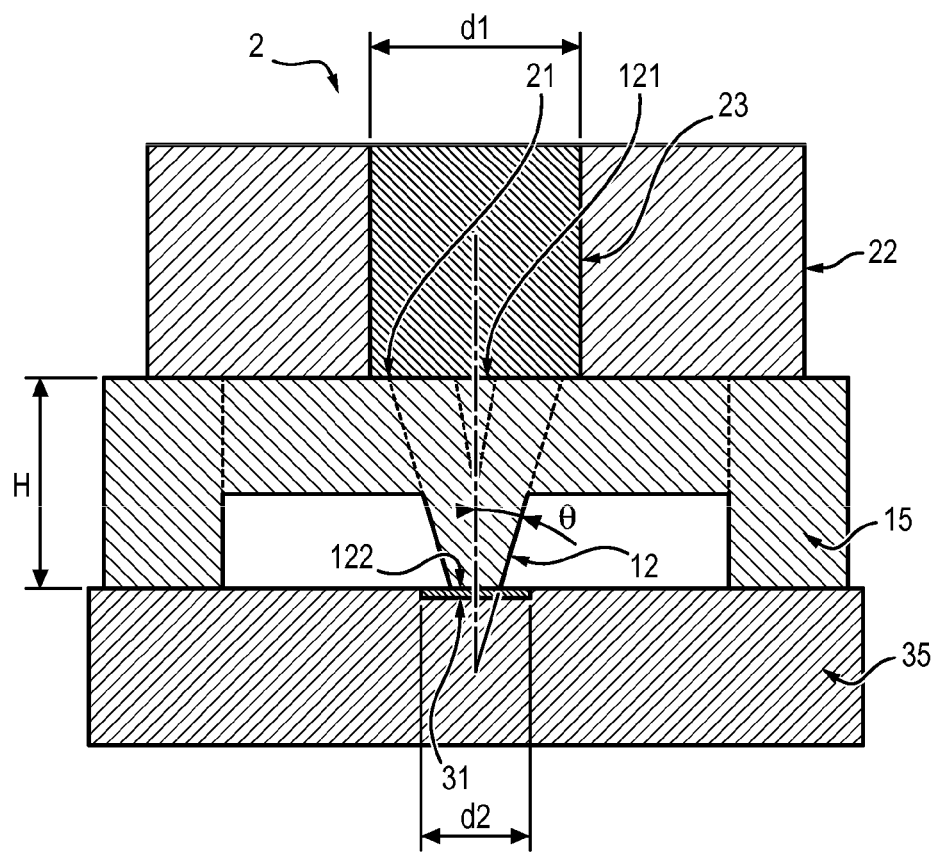
FIG. 4 represents a section view of the coupling structure coupling an optical fiber to an optical or optoelectronic component.

With reference to FIGS. 2, 3 and 4, during coupling between an optical fiber 2 and a VCSEL 3, the emission surface 31 of the VCSEL is adjoined to the truncated face 122, whereas the core 23 of the optical fiber 2 is adjoined to the base 121 of the cone, the sheath 22 of the fiber bearing on the support structure 15. The base 121 of the cone has a section of lesser dimensions than that of the core 23 of the fiber. In the case of a VCSEL, the truncated face 122 of the cone has a surface area greater than or equal to the emission surface of the VCSEL.

Figure 7:
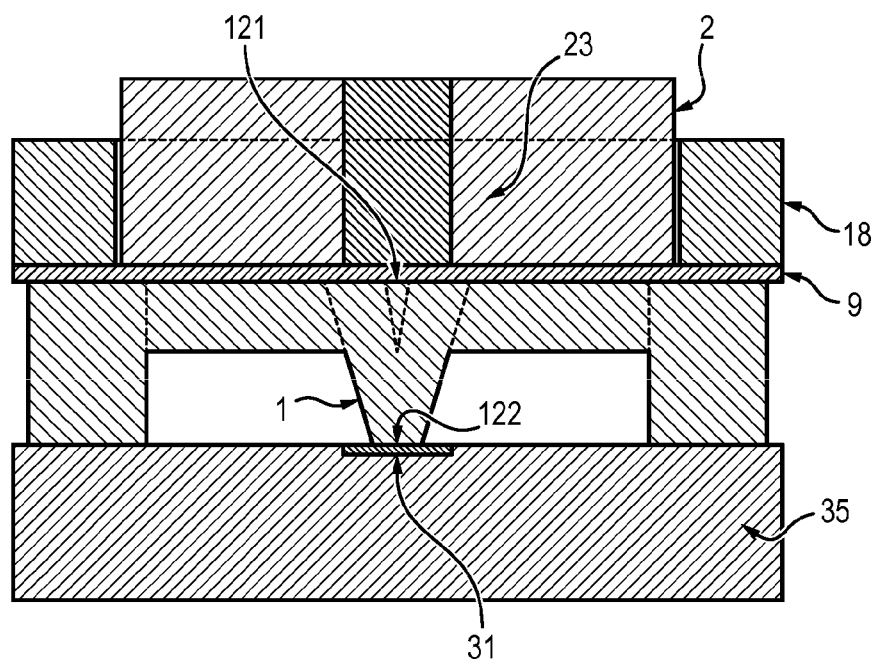
FIG. 7 represents the coupling structure in FIG. 6 coupled to an optical fiber, for which the fiber core has a width less than that of the upper part of the truncated cone coupling part (the fiber in this case is used as emitter of the optical ray)
Figure 9:
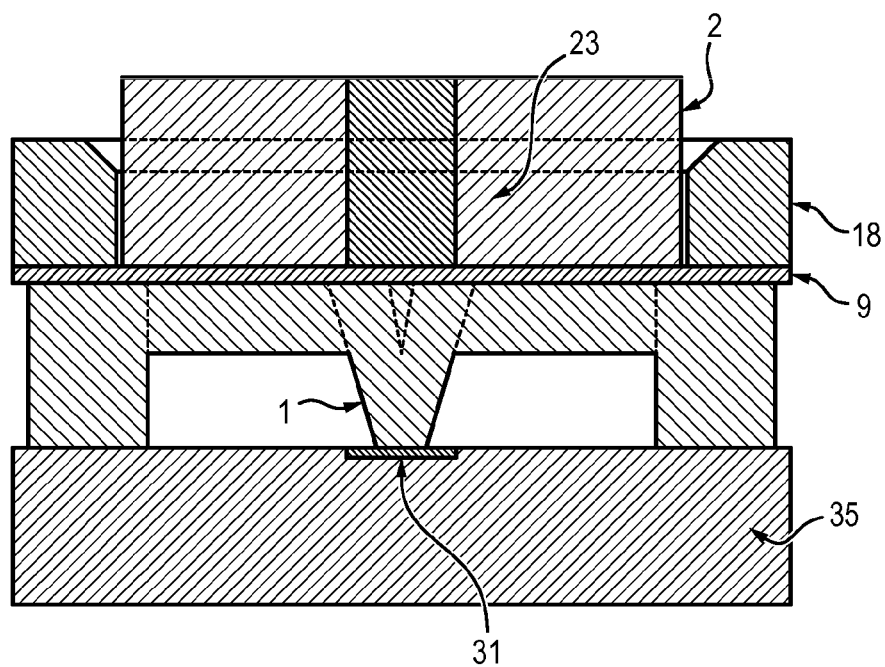
FIG. 9 represents the coupling structure in FIG. 8 for which the fiber core has a width less than that of the upper part of the truncated cone coupling part (the fiber in this case is used as emitter of the optical ray).

In the case of a photodetector, the truncated face 122 must be less than or equal to the surface area of the photodetector and the upper base 121 of the cone is greater than or equal to that of the fiber core 23 that emits the ray as illustrated in FIGS. 7 and 9.

The refractive index of the coupling part 12 must be greater than the refractive index of the ambient medium. For example in the scenario where the ambient medium is air, the refractive index of the coupling part 12 must be greater than 1. Preferably, the refractive index of the coupling part 12 must be high in order to allow better maintaining of the angles in the acceptance cone of the fiber. Thus, the refractive index of the coupling part 12 must be greater than 1, preferably greater than 2 and yet more preferably greater than 3.

Moreover, the separation between the refractive index of the coupling part 12 and the refractive indices of the materials forming the emission or reception surfaces 21 and 31 must be low in order to minimize reflection losses. Thus, the refractive index of the coupling part 12 is comprised between the refractive indices of the materials forming the emission or reception surfaces 21 or 31 of the two optical or electronic components 2 and 3 to the nearest 20% and advantageously to the nearest 10%. In the case of coupling between an optical fiber 2 and a VCSEL 3, the refractive index of the fiber core being typically in the order of 1.5 and that of the material of the emission surface of the VCSEL in the order of 3.5, the refractive index of the coupling part 12 is therefore between 1.20 and 4.20; preferably between 1.35 and 3.85. The coupling part 12 is for example preferably made of photosensitive resin.

In the cases where the components 2 and 3 have circular emission or reception surfaces, the coupling part 12 is advantageously of truncated cone shape with a circular section. If one of the optical components has a rectangular emission or reception surface, the coupling part 12 can have a rectangular section. Moreover, if the light emitted has a favored axis of polarization, the coupling part 12 advantageously has a rectangular or elliptical section oriented in such a way as to preserve the favored axis of polarization.

The term "overall truncated cone shape" is understood to mean a structure having the shape of a portion of cone contained between a plane parallel to its base and the base thereof, a cone being a volume defined by a generator, passing through a fixed point called apex and a variable point describing an enclosed planar curve. The generator is a straight line or a curved line of a curvature less than 5%.

This term notably includes truncated cone shapes with circular, rectangular, square or elliptical sections. The overall truncated cone shape can be partly hollow but is preferably solid.

The dimensions of the contact sections 121 and 122 are optimized so as to maximize overlapping of the transverse distribution of the output optical field of the first component with the reception surface of the second component. The angle θ and the height H of the cone are determined in such a way as to contain the divergence of the beam at the output of the emitting optical component, and thus maximize the adaptation of the acceptance angle and the mode between the emission component and the reception component.

Electromagnetic simulations must make it possible to optimize the dimensions and profile of the conical section, as a function of the modes emitted by the emission component and the geometry of the reception component. Such optimizations can be done using software program well-known to those skilled in the art such as the RSoft software program.

If the component 3 is a fast photodetector with a square section with sides of 10 µm and if the component 2 is a multi-mode optical fiber with a core diameter of 50 µm, emitting an optical beam with a wavelength of 850 nm, the coupling structure 1 is advantageously made of SU-8 photosensitive polymer with a square section, a truncated face 122 with sides of 10 µm, a height H greater than 25 µm and a base 121 with sides between 1.17×H+3.7 µm and 50 µm. In this configuration, the coupling structure 1 advantageously makes it possible to increase the coupling coefficient of the fiber to the photoreceiver, while relaxing the restrictions on the alignment of the optical fiber.

If the component 3 is a fast photodetector with a square section with sides of 10 µm and if the component 2 is a single-mode optical fiber with a core diameter of 9 µm, emitting an optical beam with a wavelength of 850 nm, the coupling structure 1 is advantageously made of SU-8 photosensitive polymer with a square section, a truncated face 122 with sides of 10 µm, a variable height H and a base 121 with sides of 15 µm. In this configuration, the coupling structure 1 advantageously makes it possible to relax the restrictions on the alignment of the optical fiber and if applicable to reduce reflections at the interface when compared to a coupling solution by direct contact.

If the component 3 is a high-speed VCSEL with an optical aperture diameter D, typically 8 µm, emitting an optical beam with a wavelength of 850 nm, and if the component 2 is a multi-mode optical fiber with a core diameter of 50 µm, the coupling structure 1 is advantageously made of SU-8 photosensitive polymer with a circular section, a truncated face 122 with a diameter of 7 to 9 µm, a variable height H close to 30 µm and an angle between the vertical and the generator of the conical section, between −5° and +5°, making it possible to determine the base 121 dimensions thus comprised between 4 and 12 µm for a value of D of 8 µm. In this configuration, the coupling structure 1 advantageously makes it possible to increase the coupling coefficient of the VCSEL to the multi-mode fiber, by reducing the divergence of the beam at the input of the optical fiber, while also relaxing the restrictions on the alignment of the optical fiber. It also makes it possible to maintain a high degree of coupling for VCSELs of small size, typically of a few micrometers of optical aperture diameter.

If the component 3 is a high-speed VCSEL with an optical aperture diameter of 8 µm, emitting an optical beam with a wavelength of 850 nm, and if the component 2 is a single-mode optical fiber with a core diameter of 9 µm, the coupling structure 1 is advantageously made of SU-8 photosensitive polymer with a circular section, a truncated face 122 with a diameter of 7 to 9 µm, a height H between 30 µm and 50 µm and a base 121 with a diameter between 4 µm and 9 µm. In this configuration, the coupling structure 1 advantageously makes it possible to maintain a high coefficient of coupling to the fiber, by reducing the divergence of the optical beam at the input of the optical fiber, while also relaxing the restrictions on the alignment of the optical fiber when compared to conventional solutions.

The coupling structure 1 further includes a support part 15 adapted to bear on a substrate 35 receiving one of the optical components 3 in order to hold the coupling part 12 in the coupling position in relation to the emission or reception surface of the optical component 3. The support part 15 further comprises a frame 151 suitable for bearing on the substrate 35 and suspension arms 152 connecting the coupling part 12 to the frame 151, and extending radially from the coupling part 12. The coupling structure 1 advantageously includes three or four suspension arms 152 arranged at equal angles around the coupling part 12. With reference to FIG. 5, if several optical or optoelectronic components are arranged on one and the same substrate 35, several coupling structures 12 can be juxtaposed to produce collective coupling. The presence of the support part 15 reinforces the solidity of the coupling structure 1 and prevents it from sagging.

If there is coupling between an optical fiber 2 and a VCSEL 3, the frame 151 has a cross section (perpendicular to the axis of the truncated cone) having a rectangular outer contour and a circular inner contour. The suspension arms 152 are advantageously of triangular cross section (section perpendicular to a longitudinal direction of the arm), with one apex of the triangle oriented on the side of the truncated face of the coupling part 12, in such a way as to limit emission losses at the interface between the coupling part 12 and the suspension arms 152.

Figure 6:
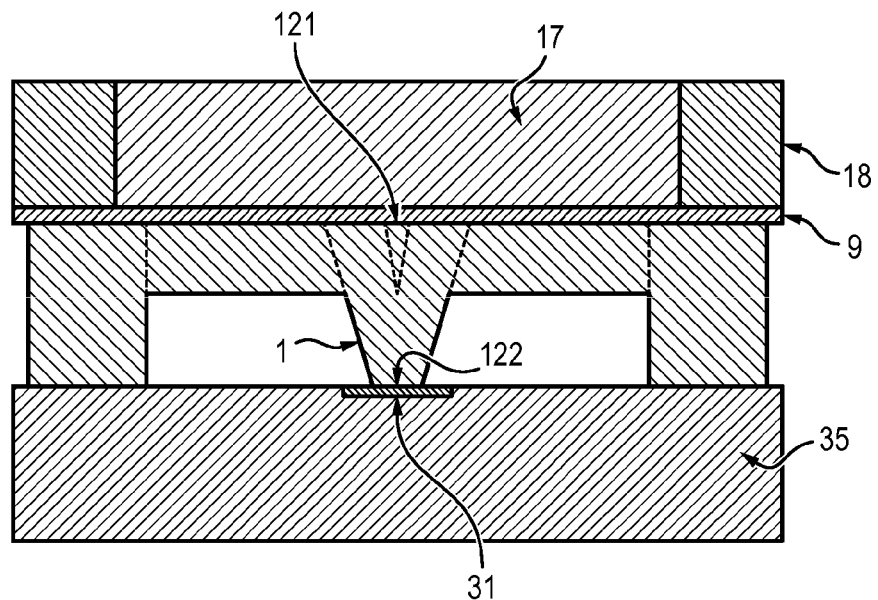
FIG. 6 represents a coupling structure according to an embodiment of the invention having a housing for guiding the optical fiber.

With reference to FIGS. 6 and 7, if the first optical or optoelectronic component 2 is an optical fiber, and the second 3 a VCSEL, the coupling structure 1 is completed by a fiber-holding structure 18 having at its center a cylindrical housing 17 suitable for receiving one end of the optical fiber 2, in such a way as to fix and adjust the position of the optical fiber 2 in alignment on the coupling structure 1. An optional separation layer 9 is inserted between the fiber-holding structure 18 and the support 15 so as to guarantee sealing and control of the nature of the outer medium, generally air, around the coupling structure 151.

The optional separation layer 9 is generally made of Silicon, Silicon Oxide, Silicon Nitride, Glass, Parylene, Polymer or resins, for example of SU8, BCB, PMMA type.

The fiber-holding structure 18 is generally made of Silicon or Polymer.

The positioning of the coupling part 12 and the optical components 2 and 3 can be done with or without pressure. Advantageously, the coupling structure 1 is made of a material of adhesive nature (for example SU8, BCB) which allows it to be held in position against the optical component by pressure.

The coupling structure 1 makes it possible to confine an optical beam emitted by an optical or optoelectronic component having an emission surface of greater diameter toward an optical or optoelectronic component having a reception surface of lesser diameter. The proposed structure notably makes it possible to couple a fast photodetector of small size, typically a few micrometers, to a multi-mode optical fiber, typically with a core diameter of 50 µm, with an efficiency greater than those obtained by the processes proposed until now, and this with a simple coupling structure that can be produced directly by lithography of the substrate of the photodetector, which makes it possible to envision collective coupling as well as a relaxation of the restrictions on the required accuracy of alignment with the fiber.

The coupling structure 1 also makes it possible to confine an optical beam emitted by an optical or optoelectronic component having an emission surface of lesser diameter toward an optical or optoelectronic component having a reception surface of greater diameter. The proposed structure notably makes it possible to couple a VCSEL to a single-mode or multi-mode optical fiber with an efficiency greater than those obtained by the processes proposed until now, and this with a simple coupling structure that can be produced directly by lithography of the substrate of the VCSEL, which makes it possible to envision collective coupling as well as a relaxation of the constraints on the requisite accuracy of alignment with the fiber.

The vertical coupling structure 1 is advantageously completed by a fiber-holding structure 18. This fiber-holding structure 18 can be made as an additional part or in the body of the material 1.

The steps of production of the matrix comprising several coupling devices depend on the material chosen. Two cases are possible: the case where the material is a photosensitive resin, and the case where the material must be machined by microelectronic techniques (Silicon, non-photosensitive resin.)

If the material is a photosensitive resin (SU8, BCB etc.), the method then consists in controlling the time of development and exposure to ultraviolet (UV) in order to adjust the edges of the polymerized pattern. A slope can be obtained and its inclination optimized by conditions of under/overexposure and under/overdevelopment. Imprint Lithography (or IL) and Nano-Imprint Lithography (NIL) techniques can alternatively be employed.

If the material must be machined by microelectronics techniques (Silicon, non-photosensitive resin), methods of Reactive Ion Etching (RIE) and Deep Reactive Ion Etching (DRIE) are advantageously used to control the etching edges. The DRIE technique on Silicon in particular allows for precise control of the edges, on rectilinear inclined shapes, of positive or negative angle, or on curved shapes.

For resin-type materials, Imprint lithography (or IL) and Nano-Imprint Lithography (NIL) techniques can alternatively be employed.

Figure 11A:
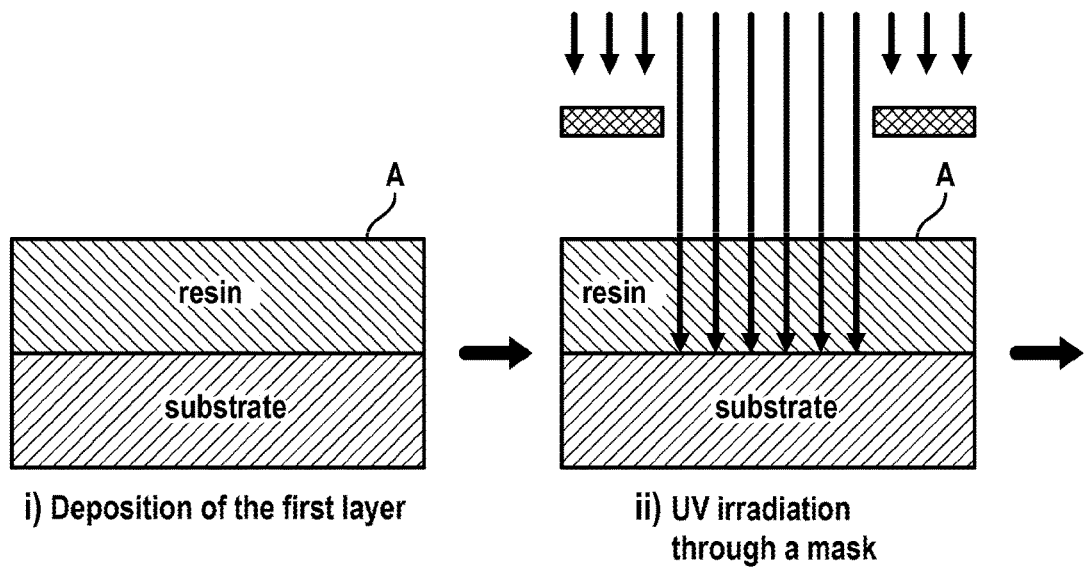
FIG. 11a illustrates a lithography method for producing a coupling structure according to an embodiment of the invention.
Figure 11A:
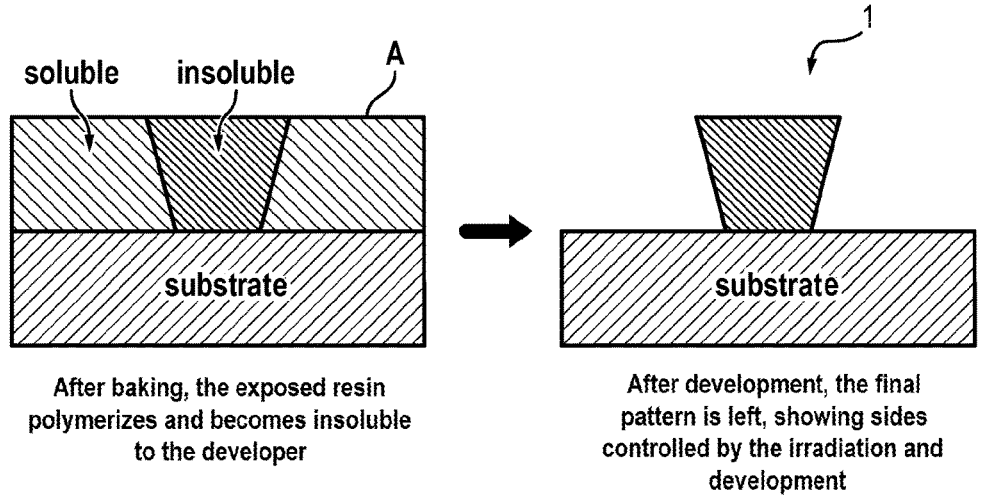
Figure 11B:
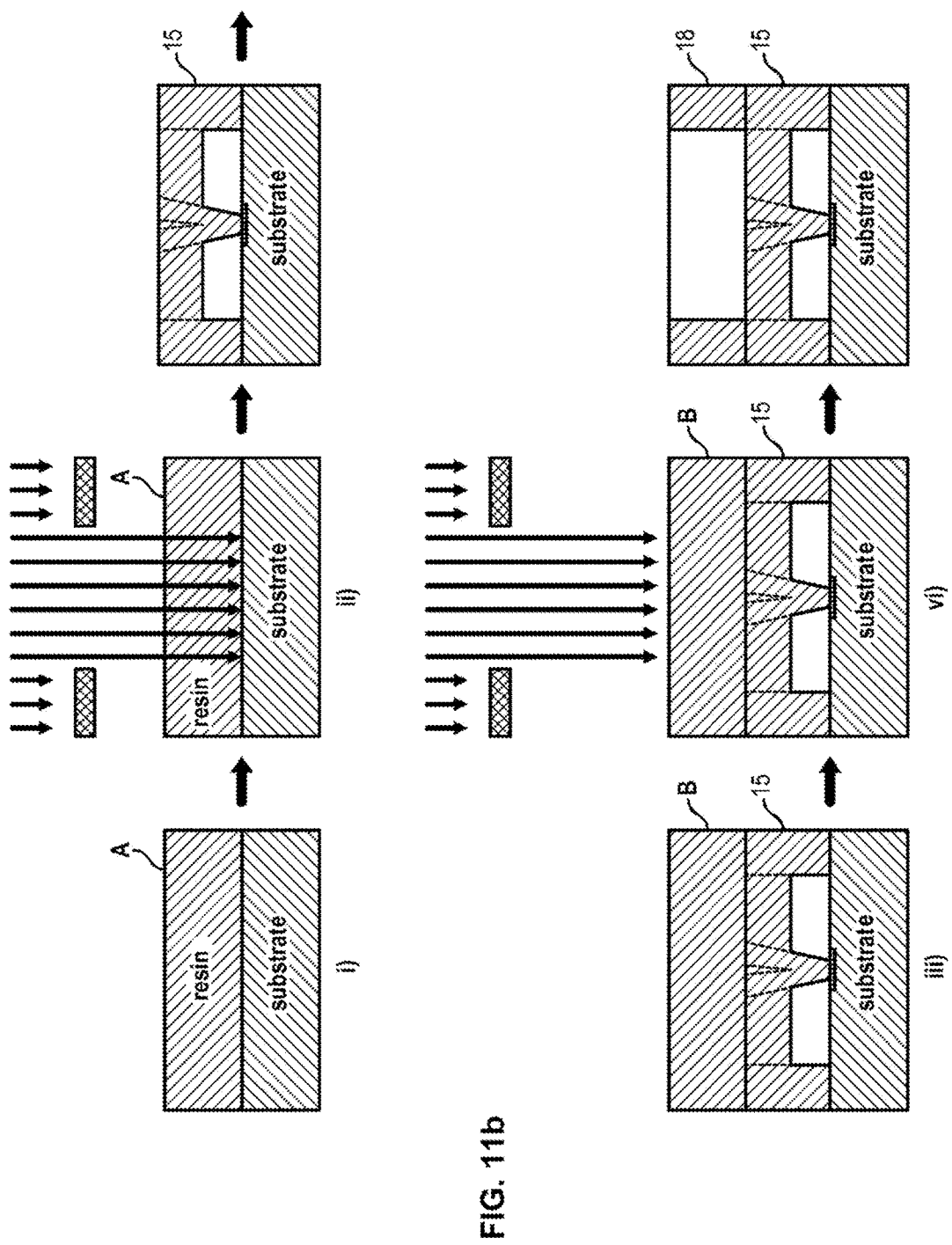
FIG. 11b illustrates a lithography method for producing a coupling structure with a fiber-holding structure and suspension arms according to an embodiment of the invention.

The photolithography production method is for example done as described above with reference to FIG. 11.

The substrate of the VCSEL is covered with a layer of photosensitive resin irradiated, in a first irradiation, using a mask, so that the part exposed to the light polymerizes. After a baking treatment, the polymerized part becomes insoluble to the developer whereas the non-exposed part of the photosensitive resin remains soluble. After dissolving the soluble photosensitive resin part, only the photosensitive resin part exposed in the first irradiation is left.

The vertical optical coupling structure 1 can also be produced in several parts assembled by compression or bonding (polymer bonding in the case of photosensitive material.) The vertical optical coupling structure 1 is alternatively produced as a single monolith. Monolithic production can be done either by a combination of photolithography and RIE techniques, or by DRIE alone (case of Silicon), or by a combination of photolithography and NIL techniques.

With reference to FIG. 13, the vertical coupling structure 1 does not mask the electrical contacts 32 of the optoelectronic component to be coupled. The electrodes thereof are located outside the support part 15, either by separation of the electrical contacts, or by adequate dimensioning of the support part 15.

The electrical contacts 32 of the optoelectronic component to be coupled can be taken using various usual techniques and particularly flip-chip techniques, thermocompression techniques, wire-bonding techniques, or photolithographic inclusion and contact techniques.

The flip-chip and thermocompression techniques require the transfer substrate for the making of interconnections to possess an opening to allow the fiber to run through it. This substrate can be common to the substrate in which the cylindrical housing is made, which can be an interposer substrate and itself possess electrical connections. This approach therefore fits into the 3D interconnection approach.

In terms of dimensions, if the anchoring structure bears the entirety of the optical fiber, its dimension is in the order of 62.5 µm in radius. The distance from a VCSEL to its electrical contacts is generally greater than this dimension. It is however possible, using photolithographic inclusion and contact techniques, to allow the contacts of the optoelectronic component to be situated below the housing of the fiber. This option will allow greater production density of the VCSELs and photodetectors.

Figure 8:
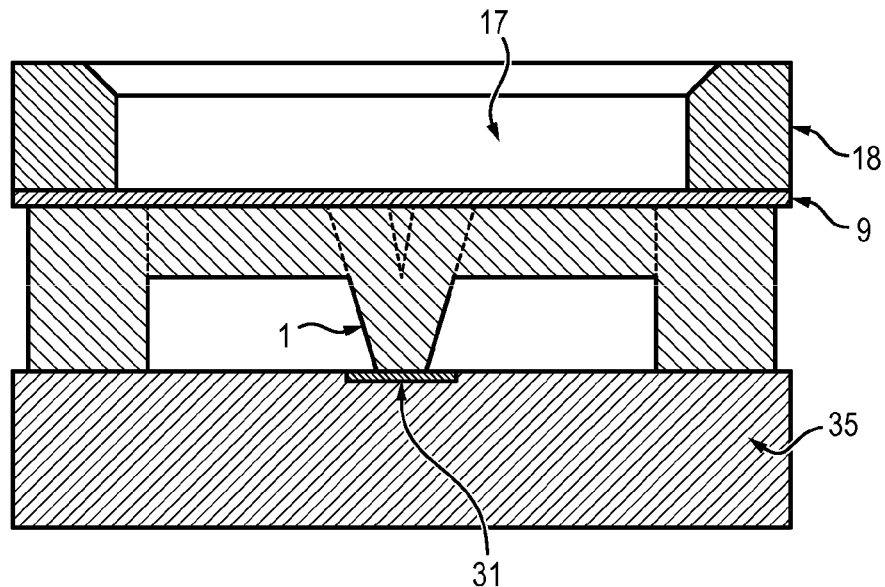
FIG. 8 represents a coupling structure according to another embodiment of the invention having a tapered holding structure.

The positioning of the fiber is done mechanically in a passive manner. It is then advisable to optimize the fiber-holding structure 18. The fiber will be brought by a mechanical transfer process (known as pick-and-place) or an automated or manual process. The apparatuses performing this operation can have a precision of alignment to the nearest 1 µm, which is easily sufficient. With reference to FIGS. 8 and 9, the holding structure 18 advantageously has an upper part of tapered shape, which advantageously facilitates the sliding of the fiber into its housing to reduce the restrictions on the positioning appliances, and can even allow for manual positioning. In this sense, there is no alignment to be done. This is done in an automatic and totally passive manner by the structure itself.

Figure 10A:
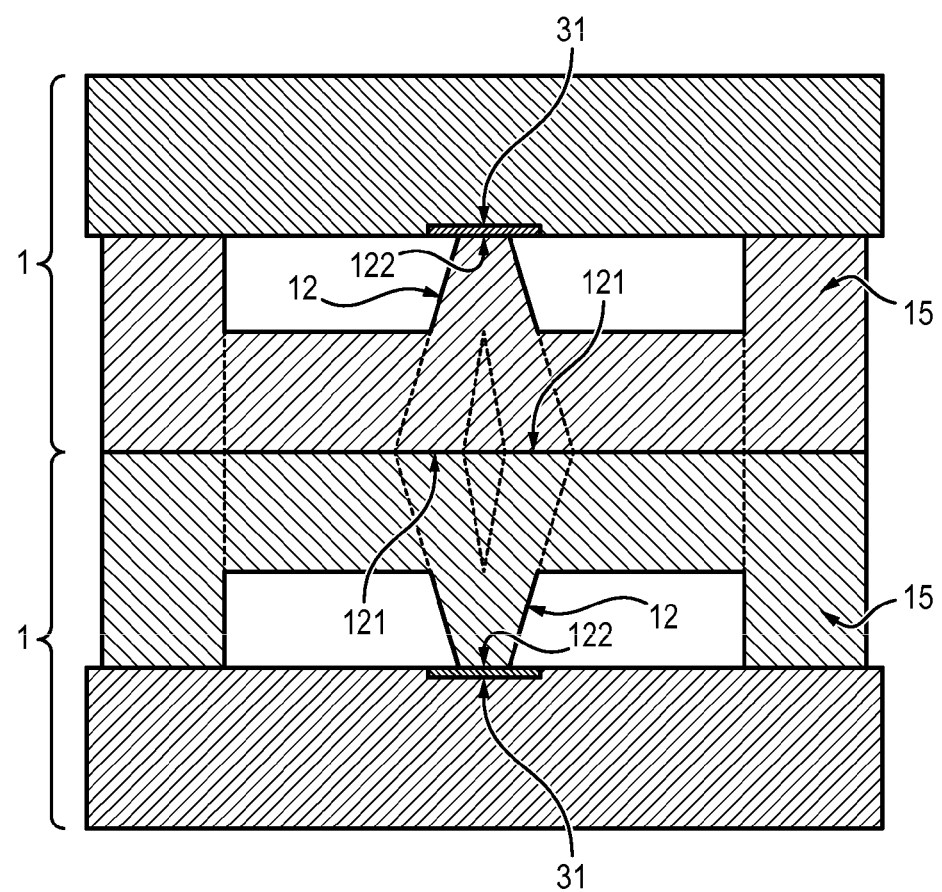
FIGS. 10a and 10b represent a coupling structure according to another embodiment of the invention.
Figure 10B:
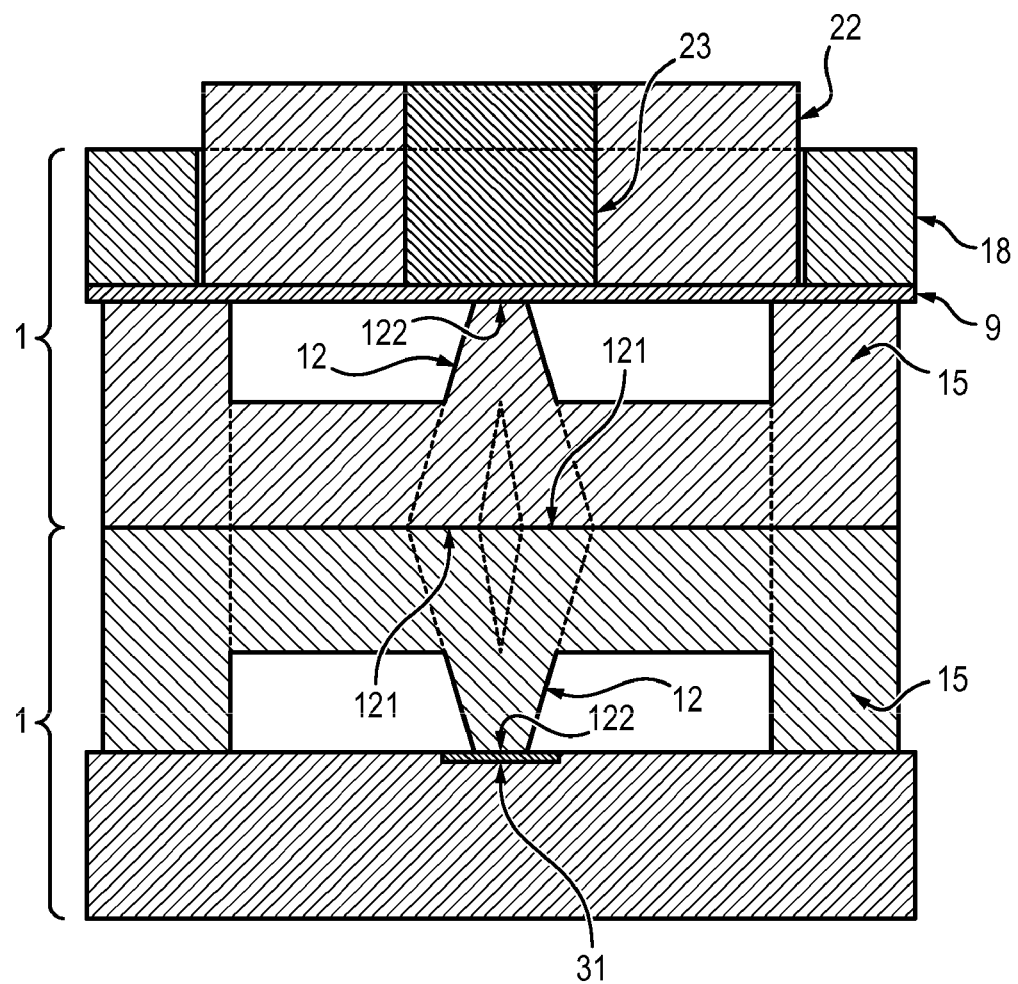
Figure 12A:
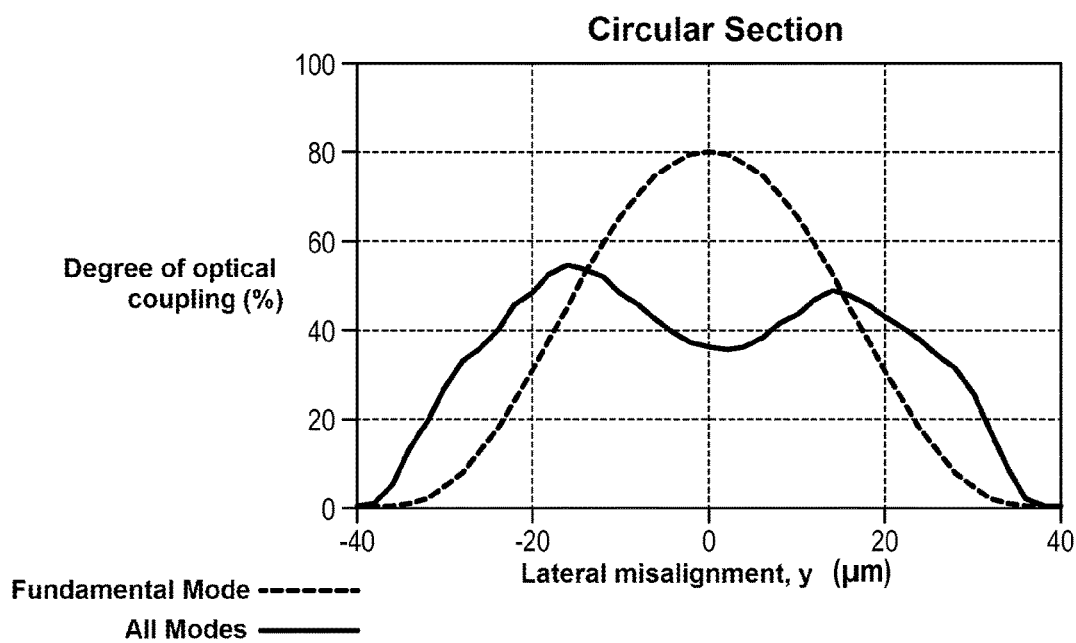
FIG. 12 represents the curves of alignment tolerance on the degree of coupling between a multi-mode fiber and a photodetector, the active detection surface of which is a square with 10 µm sides, for firstly (left-hand part) a circular coupling structure with a long diameter of 25 µm, 25 µm tall and with a short diameter 10 µm and secondly (right-hand part) a square coupling structure with a long side of 25 µm, a height of 25 µm tall and a base of 10 µm.
Figure 12B:
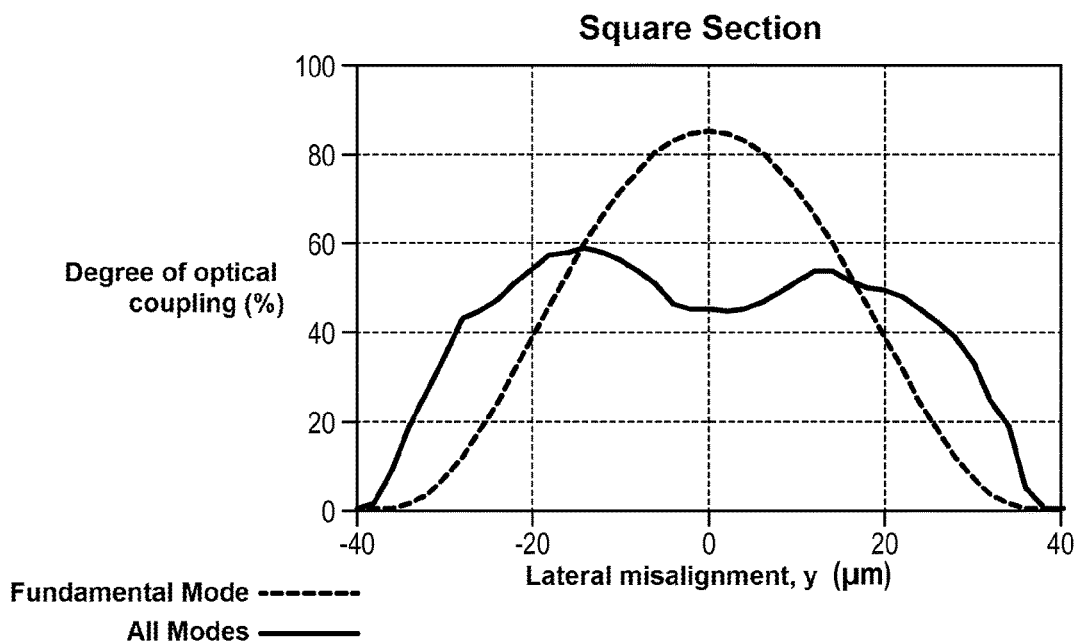

With reference to FIG. 12, taking into account the alignment by photolithography of the coupling structure 1 on the photodetector, the precision will typically be of +/−1 µm, leading to a quasi-total compliance with the maximum rate. The alignment of the fiber is however obtained differently (guiding into a slit.) For a coupling between a multi-mode optical fiber with a core diameter of 50 µm and a photodetector with an active surface with sides of 10 µm, it transpires that the alignment of the fiber can be tolerated to +/−10 µm for a coupling greater than 70% on the fundamental mode, and in all cases greater than 40%. Other conventional techniques using spherical lenses have been able to demonstrate a maximum degree of coupling of 40% over a photodetector dimension with sides of 10 µm, with a reduced modal distribution of the fiber (use of a laser with 5 transverse modes, fiber length 30 cm without mode mixers or couplers.). The proposed technique therefore contributes a significant qualitative advantage regarding the degree of coupling, at the same time as contributing a passive and collective solution. With reference to FIG. 10-a), two coupling structures can be associated. The base of the cone 121 of a first coupling structure 1 and the base of the cone 121 of a second coupling structure 1 are pressed together and the emission or reception surface 31 of the first optical or optoelectronic component is pressed against the truncated face 122 of the first coupling structure 1 whereas the emission or reception surface 31 of the second optical or optoelectronic component is pressed against the truncated face 122 of the second coupling structure 1.

This association can advantageously be done with an optical fiber in its holding housing 18 and with its interfacing membrane 9 as one of the two optical or optoelectronic components as represented in FIG. 10-b).

The invention also relates to a method for manufacturing vertical optical coupling structures 1 between first optical or optoelectronic components 2 and second optical or optoelectronic components 3 of a different size to that of the first optical or optoelectronic components 2, making it possible to produce a so-called matrix monolithic collective coupling device.

Said vertical coupling structures 1 are produced:
  by depositing a main layer A onto a substrate 35 comprising second optical or optoelectronic components in a step i;
  by lithography and/or by physico-chemical etching of the main layer in a step ii.

The term "main layer" A is understood to mean a layer that can be deformable, such as resin, or a solid layer, such as a silicon wafer, that is transferred onto the substrate and etched.

This main layer A is deposited over the whole substrate and is not housed in any mold of any kind.

The term "deposition" relates equally to the deposition of a malleable layer onto the substrate and the transfer equivalent to the installation of a solid wafer, for example made of silicon, onto the substrate.

The optical coupling structures are made in the bulk of this main layer collectively over the whole substrate using lithographic techniques, and advantageously simultaneously. The pattern of the coupling structures is borne by a mask and is reproduced by lithography on the main layer covering the substrate, thus ensuring by collective action a precision that is shared by each of the coupling structures produced. In particular, a photolithography technique can be used to transfer a masking layer onto the main layer, making it possible to continue the transfer of the pattern of the mask on the main layer by physico-chemical etching, the control of the angles of the edges of the coupling structure 1 being done by the etching control parameters.

A technique of direct photolithography onto the main layer can also be used when this layer is photosensitive, the control of the angles of the edges of the coupling structure 1 being done by adjusting the conditions of over/underexposure and over/underdevelopment.

The pattern can also be produced beforehand on a stamp, possibly produced by one of the two previous techniques, which is applied to the main layer by stamping in order to form the coupling structure. This is a stamping technique on the micro- or nanometer scale also known as Nano-Imprint-Lithography (NIL). Each of these techniques ensures the collective production of the coupling structure 1 with a precision on the micro- or even nanometer scale over the whole wafer.

Each vertical optical coupling structure 1 is produced to be located facing and in contact with a second optical component 31 located in the substrate 35.

The monolithic main layer after the step ii includes coupling parts 12 of an overall truncated cone shape composed of a material having a refractive index greater than the refractive index of air.

The coupling parts 12 each having a first transverse end surface 121 intended to be brought into contact with the emission or reception surface 21 of a first optical or optoelectronic component 2, and a second transverse end surface 122 which is in contact with the emission or reception surface 31 of the second optical or optoelectronic component 3.

In other words, by the deposition of a main layer A in a step i and the fashioning of this main layer A in a step ii, this method makes it possible to obtain coupling structures produced directly on optical components, while being very precise in their dimensioning in relation to one another, and this for small dimensions of optical components.

Advantageously, the first components are optical fibers and the second components are optical devices, sources or detectors.

In an embodiment the monolithic main layer includes the fiber-holding structure 18 having at its center a cylindrical housing 17 suitable for receiving one end of the optical fiber 2.

The minimum number and the dimensions of the arms (to avoid optical losses through the arms) notably depend on the angle θ of the truncated cone coupling part in relation to the vertical.

In an embodiment, it is possible for there to be no arms, the truncated cone coupling part due to its dimensions (small angle in relation to the vertical specifically) resting by its own weight on the substrate without the need for arms.

The invention thus makes it possible to directly produce a matrix of coupling structures (which are interconnected and are part of a single and same element or monolith known as a matrix) coupled at least to second optical or optoelectronic components arranged in a given substrate (these second components form a matrix with this substrate.)

A matrix with holding structures and first optical or optoelectronic components housed inside these holding structures can then be transferred on.

Or as an alternative, the matrix of coupling structures can be cut into sub-matrices, and a matrix transferred on, with holding structures and first optical or optoelectronic components optionally housed inside.

However, other embodiments could be envisioned.

In an embodiment, the coupling structures can be produced on a temporary substrate, and can be collectively detached and separated therefrom before cutting, or individually after cutting.

In an embodiment, a coupling structure 1 can be isolated, after cutting out of each coupling structure 1 of the matrix, and individually positioned mechanically between two optical or optoelectronic components for which the device produces the optical coupling, in a step subsequent to the manufacturing of said coupling device.

In another embodiment, the matrix of coupling structures is adapted collectively and mechanically between two matrices of the first and second optical or optoelectronic components for which the device produces the optical coupling, in a step subsequent to the manufacturing of said coupling device.

The invention also makes it possible to produce the shapes of coupling structure that are desired.

The proposed manufacturing method makes it possible to dimension the slopes of the cones, to produce straight or curved slopes, or slopes with other longitudinal shapes (according to the vertical height) of the cones as desired In a matrix, it is also possible to have different conical shapes, and coupling structures with a different number of arms, as drawn in FIGS. 5 and 13.

The dimensions of the contact sections 121, 122 are optimized so as to maximize overlapping of the transverse distribution of the output optical field of the first component with the reception surface of the second component, while also allowing for a variation in the positioning between the optical fiber and the contact section 121, and between the optical or optoelectronic component 2 and the contact section 122. The angle θ and the height H of the cone are determined in such a way as to contain the divergence of the beam at the output of the emission optical component, and thus maximize the adaptation of the angle of acceptance and mode between the emission component and the reception component.

Figure 14:
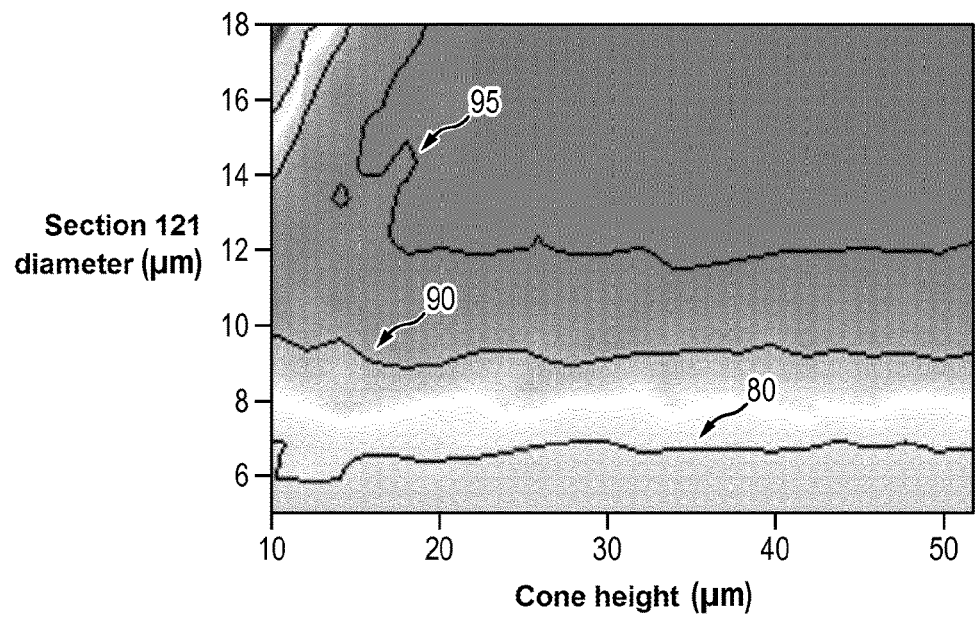
FIG. 14 illustrates the case of coupling between a single-mode optical fiber with a core diameter of 9 µm with a photoreceiver of 5 µm.

In other words, for a given second diameter, at a given wavelength, the ratio of the height to the first diameter is determined in such a way as to ensure optical coupling of at least 60% between the two optical or optoelectronic components for a variation of misalignment between the two optical or optoelectronic components of at least 5 micrometers from the maximum coupling value (more or less.) In other words, a total misalignment of at least 10 micrometers for a coupling at least equal to 60%. The following FIG. 14 illustrates the case of coupling between a single-mode optical fiber with a core diameter of 9 µm with a photoreceiver 31 with a diameter of 5 µm (corresponding to DW) with a wavelength of 1550 nm, by representing the degree of coupling expected as a function of the diameter of the cone 121 base (corresponding to TWF) as the ordinate and as a function of the cone height (corresponding to TH) on the abscissa.

The material used is an SU-8 photosensitive polymer resin. The diameter of the truncated face 122 (corresponding to TWD) is fixed at 5 µm in diameter. It is indicated there that a dimension of 12 µm minimum is required for a minimum cone height of 20 µm.

It is beneficial to increase the dimension of the section 121 in order to ensure better tolerance to misalignment of the optical fiber and thus to ensure passive coupling more easily. The cone height must then be increased in proportion with this curve. In this way it is possible to identify a maximum angle to comply with.

The misalignment can be defined as the horizontal distance between the first optical or optoelectronic component 23 and the second optical or optoelectronic component 31.

Figure 15:
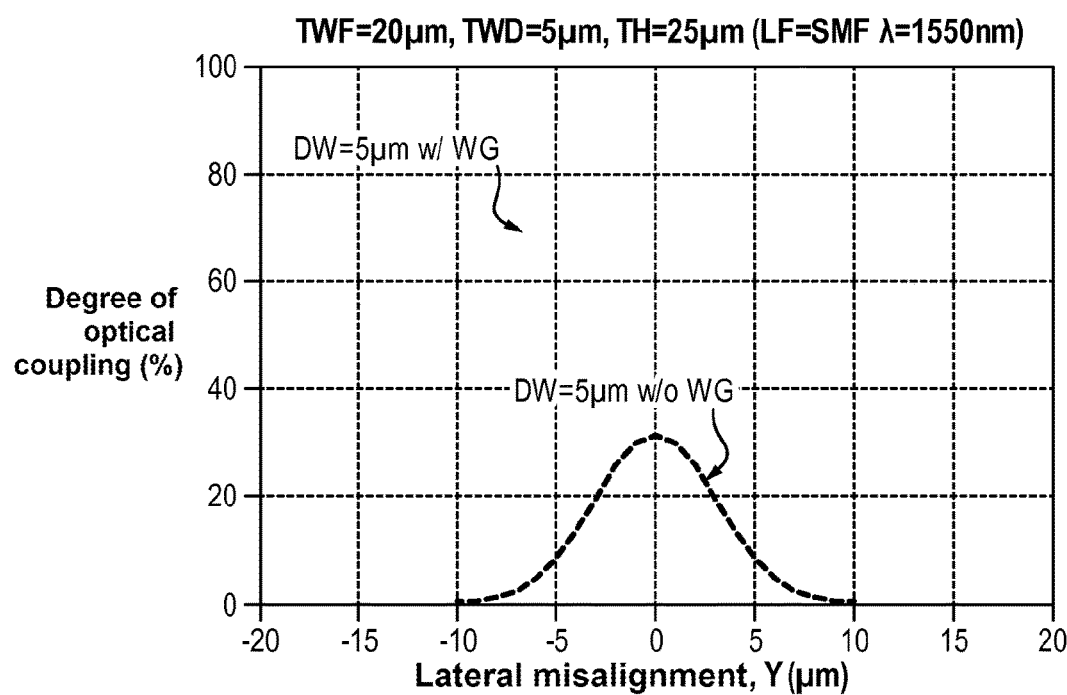
FIG. 15 illustrates, for the same conditions as those in FIG. 14 but with a dimension of 20 µm for the upper base section of the coupling part, the following

The next FIG. 15 illustrates for the same conditions, and for a dimension of 20 µm for the section 121, and a height of the coupling part 12 of 25 µm, the tolerance to separation in the position of the optical fiber in relation to the center of the axis of the coupling part 12.

In the presence of a coupling structure 1, a degree of coupling of over 95% is expected, as opposed to less than 40% without, and a tolerance to misalignment of the fiber of over +/−5 µm at the curve's mid-height, making it possible to ensure the passive nature of the alignment by simple mechanical positioning of the optical fiber vis-à-vis the structure. It is possible to increase the dimension of the section 121, by observing the dimension restrictions given by the previous figure for the angle and height of the cone.

Figure 16:
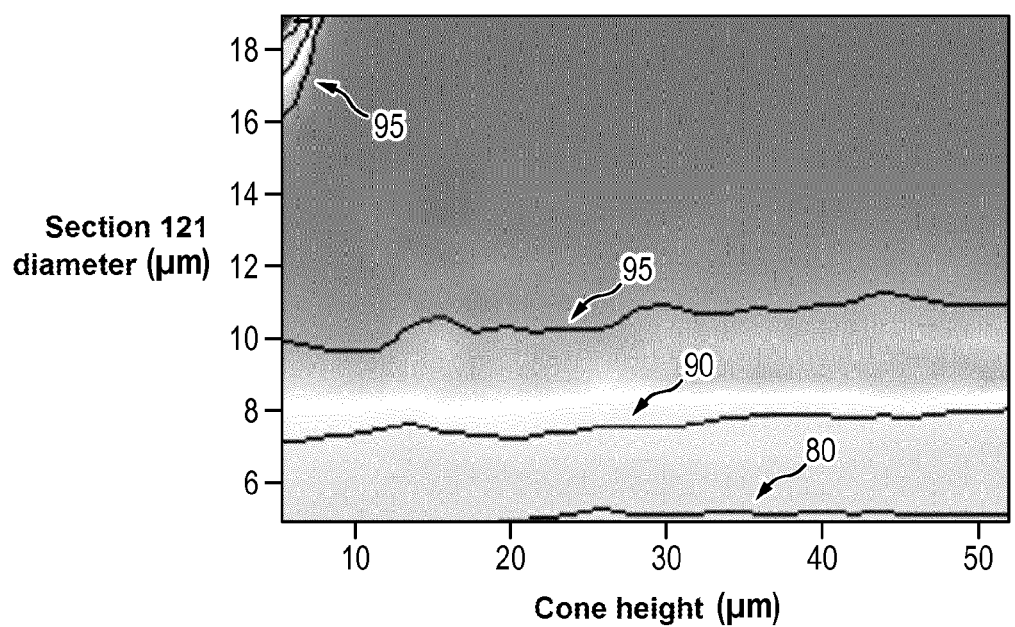
FIGS. 16 and 17 show the results obtained in the case of a section with a diameter of 10 µm, compatible with photoreceivers with a diameter of 10 µm.
Figure 17:
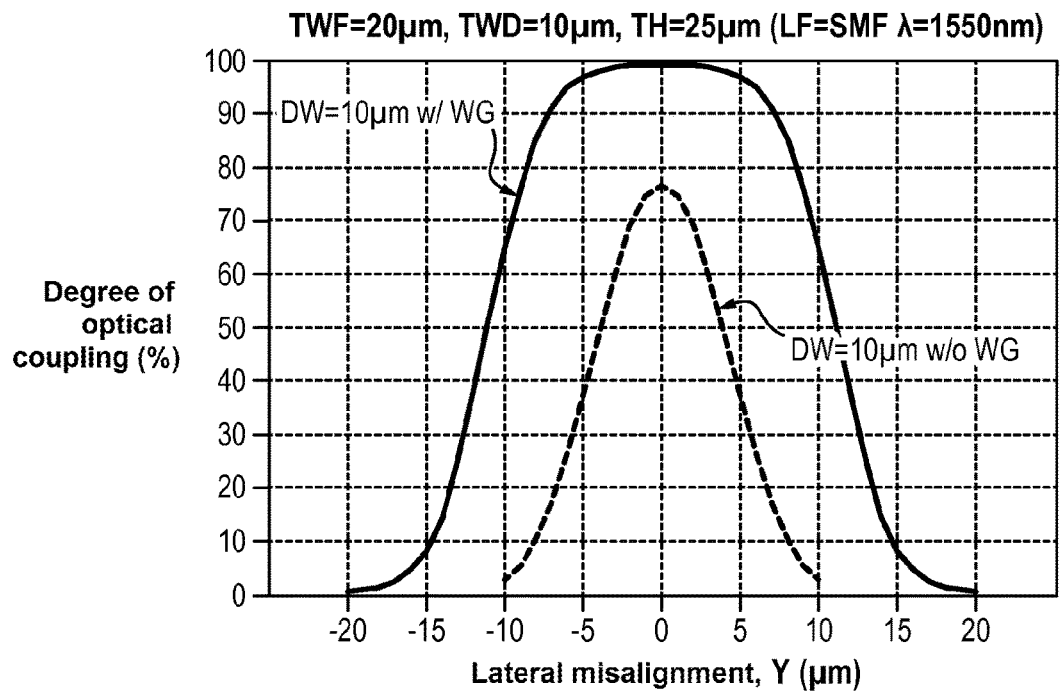

The following FIGS. 16 and 17 show the results obtained in the case of a section 122 with a diameter of 10 µm, compatible with circular photoreceivers with a diameter of 10 µm.

Figure 18:
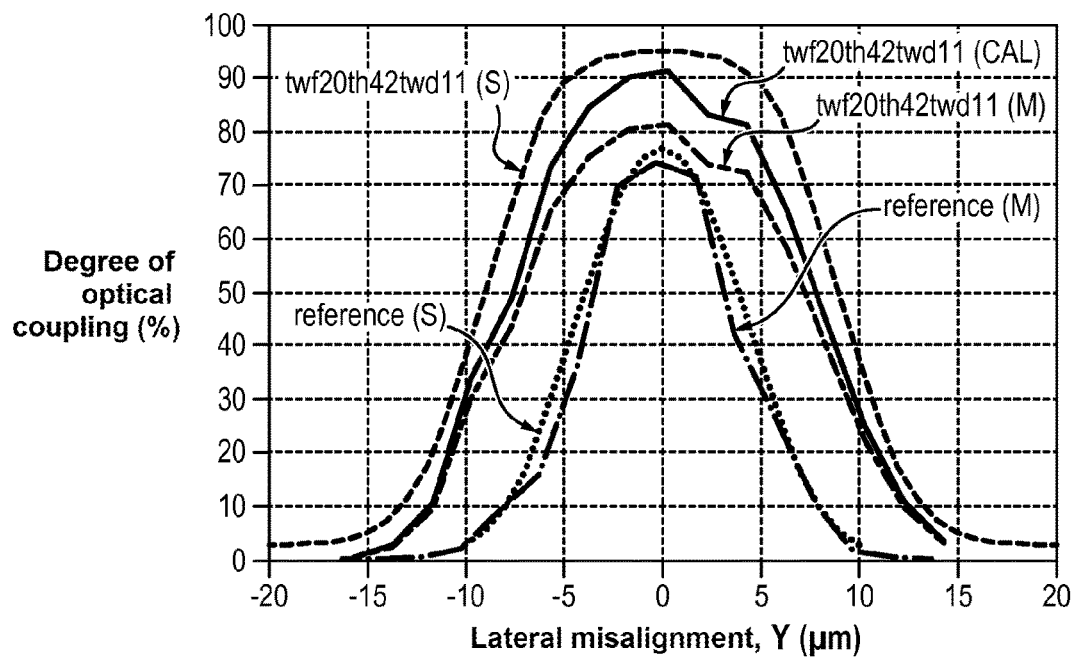
FIG. 18 shows the preliminary experimental results obtained using an SU8 resin to couple a single-mode fiber with a wavelength of 1550 µnm with a core diameter of 9 µm.

The following FIG. 18 shows the preliminary experimental results obtained using an SU8 resin to couple a single-mode fiber with a wavelength of 1550 nm and a core diameter of 9 µm. FIG. 18 shows the results of the simulation (S) and measurement (M) of the coupling between a photoreceiver represented by a diaphragm with a circular section with a diameter of 10 µm and the fiber, as a function of the alignment of the fiber in relation to the central axis of the coupling structure.

The coupling structure 1 has been chosen according to the previous curves as having a height of 42 µm, a circular section 122 with a diameter of 11 µm and a circular section 121 with a diameter of 20 µm, without arms. The simulation results are represented by the curve twf20th42twd11 (S). A peak value of the degree of coupling of nearly 95% is obtained.

The measurement results are represented by the curve twf20th42twd11 (M).

For experimental reasons the fiber and the coupling structure 1 are separated by an air gap of approximately 10 μm in the direction of the vertical. This gap incurs a reflection at the interface both of the fiber with the air, and of the air with the coupling structure, as well as a certain loss of efficiency. This loss will tail off upon contact and explains the difference between the measurements (M) and the simulations (S). A maximum degree of coupling of nearly 80% is demonstrated in the case of this air gap of 10 μm.

A measurement point is made by putting the fiber directly in contact with the optical coupling structure 1, for the position of the fiber which maximizes the degree of coupling. This measurement is identified by an isolated black cross with a degree of coupling reaching nearly 90% experimentally.

This result coincides with the simulation results, and validates the improvement of the optical coupling by the coupling structure 1. The curve twf20th42twd11 (CAL) is calculated by applying a factor so as to normalize the curve twf20th42twd11 (M) measured on the optimal coupling point in direct contact measured.

It thus shows a worst-case estimate of what could be the final experimental curve of the rate of coupling of the optical fiber to the photodetector, under direct contact conditions. At mid-height, the curve experimentally demonstrates a tolerance to misalignment at least greater than +/−8 μm. The theory predicts a tolerance that could be greater if the measurement conditions allowed a mapping in a situation of guaranteed constant contact.

The benefit of the coupling structure 1 is thus demonstrated. The coupling structure makes it possible to widen the tolerance of misalignment of the fiber in relation to the detector beyond +/−7 μm at mid-height, on the one hand, and to improve the maximum degree of coupling.

FIG. 18 also shows in comparison the simulations (S) and measurements (M) of the coupling of this same diaphragm to the same fiber in the absence of a coupling structure, forming a reference for evaluating the quantitative contribution of the coupling structure. An air gap of 10 μm is made between the optical fiber and the diaphragm in the vertical direction for the same measurement restrictions as previously. The simulations take this into account. The equivalence between measurements and simulations validates the simulation tools. These results also confirm the benefit of the presence of the coupling structure 1 when compared to a direct contact solution (butt-coupling) which requires a greater precision of alignment (tolerance of +/−5 μm at mid-height experimentally) for a lower maximum degree of coupling (here approximately 60%).

This coupling structure 1 makes it possible to obtain efficiencies greater than 50% between two devices with small core dimensions or active surfaces, for example between a VCSEL with a 10 μm optical window to a silica optical fiber with a core diameter of 50 μm or 9 μm.

With a drastic reduction in manual handling (active positioning of the fiber with the laser switched on), the cost can be brought down to the cost of the polymer lithography alone, which would thus be incorporated into the overall manufacturing cost of the optoelectronic component. Whereas at present the unit of a laser costs 80% of the cost of the final device, here the invention can make it possible to divide this cost by at least a factor of 2.

In terms of performance, degrees of coupling between 60 and 80% are obtained with alignment tolerances of +/−10 μm between a VCSEL with an aperture of 8 μm and a multi-mode fiber with a core of 50 μm.

The invention claimed is:

1. A method for manufacturing vertical optical coupling structures between first optical or optoelectronic components and second optical or optoelectronic components, to produce a collective coupling matrix which presents, each of said vertical coupling structures coupled to a second optical or optoelectronic component arranged in a substrate, the collective coupling matrix being produced:
   by depositing a main monolithic layer onto the whole substrate comprising second optical or optoelectronic components in a step (i); and
   by lithography of the main monolithic layer, the main monolithic layer comprising a resin or by physicochemical etching, such as deep reactive ion etching (DRIE), of the main monolithic layer, the main monolithic layer comprising a silicon wafer, in a step (ii), thereby simultaneously realizing said vertical coupling structures,
   wherein each vertical optical coupling structure is located facing and is in contact with a second optical component located in the substrate,
   wherein the monolithic main layer includes coupling parts of an overall truncated cone shape composed of a material with a refractive index greater than the refractive index of air after performing step (ii); and
   wherein each of the coupling parts has a first transverse end surface intended to be in contact with the emission or reception surface of a first optical or optoelectronic component, and a second transverse end surface which is in contact with the emission or reception surface of the second optical or optoelectronic component.

2. The manufacturing method according to claim 1, characterized in that the step (ii) is done by photolithography.

3. The manufacturing method according to claim 1, characterized in that the step (ii) leads to the obtaining, for each vertical optical coupling structure, of a support part equipped with a suspended frame suitable for bearing on the substrate, and suspension arms connecting the coupling part to the frame.

4. The manufacturing method according to claim 1, characterized in that a second layer is deposited onto the main layer in a step (iii), this second layer making it possible to produce in a step (vi), by lithography and/or physicochemical etching, holding structures intended to receive a first optical or optoelectronic component in a cylindrical housing.

5. The manufacturing method according to claim 1, characterized in that imprint lithography and/or nano-imprint photolithography techniques are used to produce the vertical coupling structure.

6. The manufacturing method according to claim 1, characterized in that the main layer is machined by reactive-ion etching and/or deep reactive-ion etching techniques.

7. The manufacturing method according to claim 1, characterized in that the substrate is hollowed out at the housings to arrange various second optical or optoelectronic components in these housings, flush with an upper surface of the substrate; the second optical or optoelectronic components being connected to one another by metal tracks.

8. The manufacturing method according to claim 1, characterized in that the first and second optical or optoelectronic components have dimensions of less than 20 μm.

9. A collective coupling matrix produced by the method of claim 1, the collective coupling matrix comprising:
   a substrate with second optical or optoelectronic components, each having an emission or reception surface;

a main monolithic layer which is a resin or a silicon wafer, in contact with the substrate, and which has vertical coupling structures, each vertical coupling structure comprising a coupling part of an overall truncated cone shape composed of a material with a refractive index greater than the refractive index of air;

the coupling parts each having a first transverse end surface intended to be in contact with the emission or reception surface of a first optical or optoelectronic component, and a second transverse end surface with is in contact with the emission or reception surface of the second optical or optoelectronic component.

10. A collective coupling device including:

first optical or optoelectronic components each having an emission or reception surface; and a collective coupling matrix according to claim 9, and which presents:

second optical or optoelectronic components each having an emission or reception surface and located in a substrate;

vertical coupling structures realized in a main monolithic layer of a resin or in a silicon wafer, in contact with the whole substrate, each comprising a coupling part of an overall truncated cone shape composed of a material with a refractive index greater than the refractive index of air and having a given height;

wherein each coupling part has a first transverse surface having a first diameter, the first transverse surface being in contact with the emission or reception surface of a first optical or optoelectronic component; and a second transverse surface; having a second diameter;

for each vertical coupling structure, the dimensions of the first and second transverse surfaces are chosen to produce overlapping of the transverse distribution of the output optical field of the first optical or optoelectronic component with the emission or reception surface of the second optical or optoelectronic component while allowing a variation in the positioning between the first optical or optoelectronic component and the first transverse surface, and between the second optical or optoelectronic component and the second transverse surface, wherein the second transverse surface of the coupling part is in contact with the emission or reception surface of a second optical or optoelectronic component; and wherein for a given second diameter, at a given wavelength of an optical beam, the ratio of the height to the first diameter is determined in such a way as to provide optical coupling of at least 60% between the first optical or optoelectronic component and the second optical or optoelectronic component, for a variation of misalignment between the two optical or optoelectronic components, of at least 5 micrometers, more or less, in relation to a position of maximum coupling between the two optical or optoelectronic components.

11. The device according to claim 10, wherein the second optical or optoelectronic components are photodetectors, the first optical or optoelectronic components are single-mode optical fibers, each coupling structure including a first transverse surface greater than or equal to the surface of a core of a single-mode optical fiber and a second transverse surface less than or equal to the surface of the second optical or optoelectronic component.

12. The device according to claim 10, wherein the second optical or optoelectronic components are photodetectors, the first optical or optoelectronic components are multi-mode optical fibers, each coupling structure including a first transverse surface greater than or equal to the surface of a core of a multi-mode optical fiber and a second transverse surface less than or equal to the surface of the second optical or optoelectronic component.

13. The device according to claim 10, wherein the second optical or optoelectronic components are VCSELs and the first optical or optoelectronic components are multi-mode optical fibers, each coupling structure including a first transverse surface less than or equal to the surface of a core of a multi-mode optical fiber.

14. The device according to claim 10, wherein the second optical or optoelectronic components are VCSELs and the first optical or optoelectronic components are single-mode optical fibers, each coupling structure including a first transverse surface less than or equal to the surface of a core of a single-mode optical fiber.

15. The device according to claim 10, wherein the second optical or optoelectronic components are optical fibers, and the first optical or optoelectronic components are optical fibers.

16. The device according to claim 10, wherein the second optical or optoelectronic components are VCSELs, respectively photodetectors, and the first optical or optoelectronic components are photodetectors, respectively VCSELs.

17. The device according to claim 10, wherein the device includes holding structures on the vertical coupling structures, intended to receive the first optical components.

18. The matrix according to claim 9, wherein the second optical or optoelectronic component has a dimension of less than 20 μm.

19. The matrix according to claim 9, wherein the vertical coupling structures comprise support parts monolithic with the coupling parts, each support part equipped with a suspended frame suitable for bearing on the substrate, and suspension arms connecting the coupling part to the frame and extending radially from the coupling part, in order to hold by the suspension arms.

20. The matrix according to claim 19, wherein the suspension arms have a triangular cross section, with one apex of the triangle oriented on the side of the truncated face of the coupling part.

* * * * *